United States Patent
Reichel et al.

(10) Patent No.: US 6,794,881 B1
(45) Date of Patent: Sep. 21, 2004

(54) ARRANGEMENT FOR MEASURING THE ROOT MEAN SQUARE OF A POWER FREQUENCY VOLTAGE ACROSS A LARGE DYNAMIC RANGE, ESPECIALLY FOR MEASURING ELECTRICAL OUTPUT

(75) Inventors: Thomas Reichel, Baldham (DE); Toralf Bratfisch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 74 days.

(21) Appl. No.: 10/130,735
(22) PCT Filed: Aug. 25, 2000
(86) PCT No.: PCT/EP00/08309
§ 371 (c)(1), (2), (4) Date: Jul. 30, 2002
(87) PCT Pub. No.: WO01/36988
PCT Pub. Date: May 25, 2001

(30) Foreign Application Priority Data

Nov. 17, 1999 (DE) .......................................... 199 55 342

(51) Int. Cl.⁷ .............................................. G01R 31/08
(52) U.S. Cl. ......................... 324/522; 324/115; 324/119
(58) Field of Search .................................. 324/522–524, 324/95, 115, 119, 133, 114; 361/56–57, 65, 91.1, 91.2, 93.1–93.9

(56) References Cited

U.S. PATENT DOCUMENTS

| | | | | |
|---|---|---|---|---|
| 4,873,484 A | * | 10/1989 | Adam | .......................... 324/95 |
| 4,876,654 A | * | 10/1989 | Herscher | ...................... 702/60 |
| 4,943,764 A | * | 7/1990 | Szente et al. | .................. 324/95 |
| 5,204,613 A | * | 4/1993 | Cripps et al. | .................. 324/95 |

* cited by examiner

*Primary Examiner*—Minh H Chau
(74) *Attorney, Agent, or Firm*—Lewis, Rice & Fingersh, LC

(57) ABSTRACT

The root mean square of a power frequency voltage is measured across a large dynamic range, for example in order to measure electrical output, by converting the voltage to be measured into two or more partial voltage proportional thereto and measuring each partial voltage using an individual diode rectifier. The output voltages of said diode rectifiers are then converted into a digital value and each of these digital values is weighted with weighting factors, the ratio of said weighting factors being derived from the control factor of at least one of the diode rectifiers. These weighted digital values are then scaled to a common quantification unit and added to achieved the actual digital measurement value.

13 Claims, 3 Drawing Sheets

Figure 1:
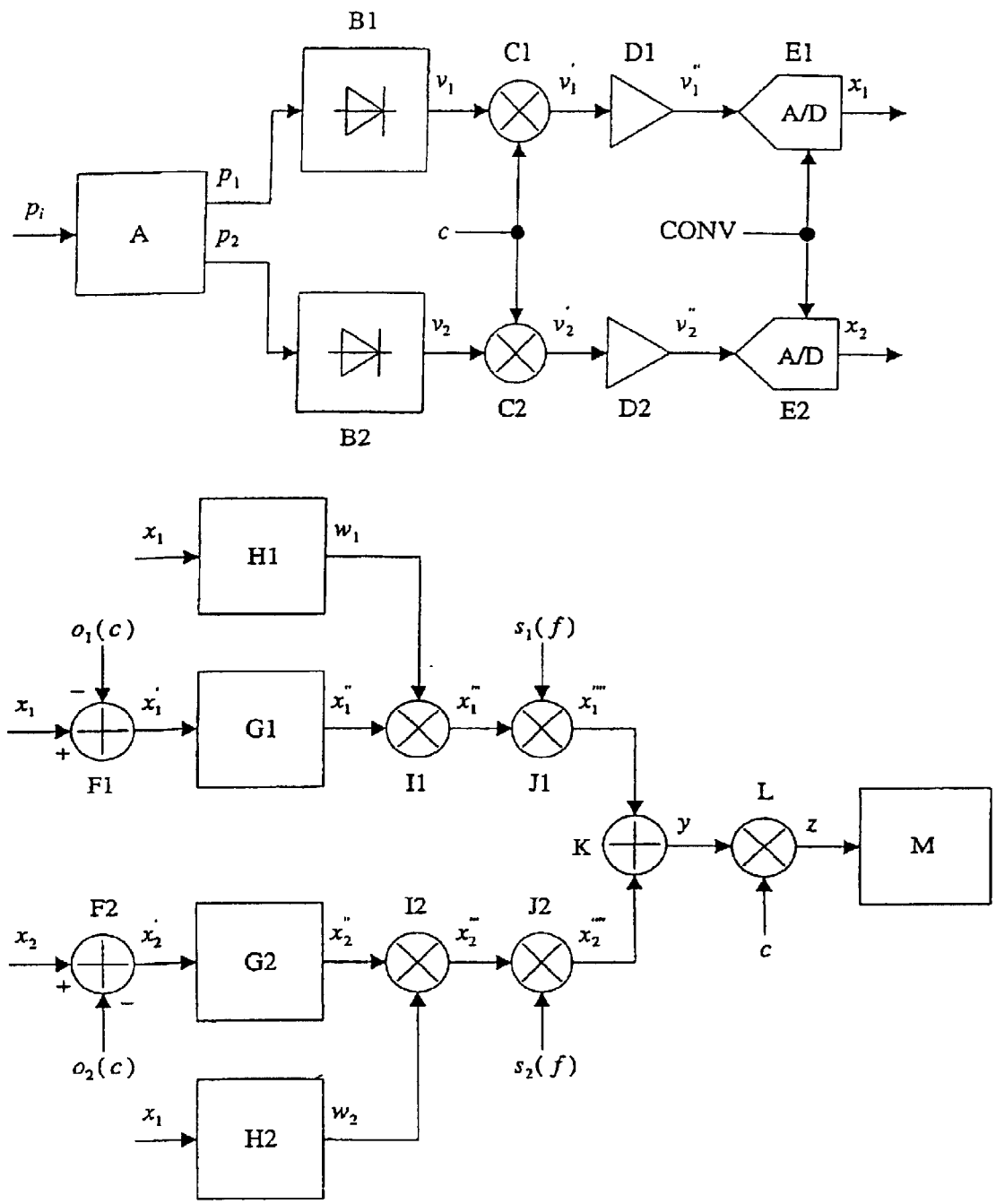

ARRANGEMENT FOR MEASURING THE ROOT MEAN SQUARE OF A POWER FREQUENCY VOLTAGE ACROSS A LARGE DYNAMIC RANGE, ESPECIALLY FOR MEASURING ELECTRICAL OUTPUT

The invention relates to, and is based on, an arrangement according to the precharacterising clause of the main claim.

Arrangements of this type are known (U.S. Pat. Nos. 4,873,484 and 4,943,764). The large dynamic range is divided up between two or more diode rectifiers, the output voltage of each individual diode rectifier being evaluated only when it is operating in a usable section of its quadratic characteristic-response range. The output voltages of the diode rectifiers are fed via a measurement-range changeover switch to a single evaluation circuit, i.e. the output voltage of only a single diode rectifier is ever evaluated. If, in the event of abrupt changes in the measurement quantity or owing to modulation, the usable characteristic-response section of the currently active diode rectifier is departed from, this makes it necessary to terminate the measurement taking place, switch over to a favourable diode rectifier, i.e. one which is operating in the usable characteristic-response range, wait for the transient settling time of the evaluation circuit to elapse, and start a new measurement. This makes it difficult or impossible, in particular, to observe one-off (transient) processes which are not covered by the dynamic range of a single diode rectifier. Especially in the case of radiofrequency signals with a time-varying envelope-curve power, in which the ratio between the maximum value and the average value of the envelope-curve power is very large, such known methods which operate with range changeover have the disadvantage that the measurement range must be selected in such a way that individual brief power peaks do not overdrive the circuit. The effect of this, however, is that the circuit is driven at a low level for most of the time, so that the signal-to-noise ratio is small.

It is an object of the invention to provide such an arrangement for measuring the rms value of a voltage over a large dynamic range, in which these disadvantages are avoided and which permits accurate error-free measurement even in the event of a time-varying envelope-curve power, for example in response to abrupt changes in the measurement quantity or owing to modulation.

This object is achieved, on the basis of an arrangement according to the precharacterising clause of the main claim, by the characterising features thereof. Advantageous refinements are given in the dependent claims.

In the arrangement according to the invention, a changeover switch is obviated and, for each diode rectifier, a separate channel is provided to treat the voltage components measured by the diode rectifier. In this case, the term "voltage component" is intended to mean either a fraction or a multiple of the input voltage to be measured. Separate analogue/digital conversion with subsequent digital signal processing takes place in each channel. When very fast A/D converters are used, the digitising of the separate channels could also take place sequentially, i.e. in these cases it is sufficient to have only a single A/D converter, the processing path being split again into two separate branches immediately after this A/D converter. The digital values of all the channels are correspondingly weighted according to their information content and are scaled. The sum of the weighting factors is in this case one. The individual weighting factors, or their ratio, is derived from the drive level of at least one of the diode rectifiers. The measurement channel for the higher powers will, for example, deliver measurement results at the lower limit of its measurement range which have greater measurement errors than in the more sensitive measurement channel. With increasing power, the situation will be reversed, for example owing to overdrive effects in the more sensitive measurement channel. Depending on the relationship between measurement error and power, different weighting functions will therefore be used in the context of the dependent claims. So that the results from the individual channels can subsequently be added to give an output value, the weighted digital values of the individual channels furthermore need to be scaled in such a way that they can be represented as a fraction or as a multiple of a common quantisation unit.

An arrangement according to the invention is suitable not only for the accurate measurement of radiofrequency signals with a constant envelope-curve power as a function of time (CW signals) but also, above all, for the accurate measurement of radiofrequency signals with a time-varying envelope-curve power, as is the case for example with modulated radiofrequency signals. This is because, in the arrangement according to the invention, a measurement value is obtained, for each individual sample value of the A/D converter, by weighting and scaling the corresponding digital value.

An arrangement according to the invention for measuring the rms value of an AC voltage over a large dynamic range is suitable not only for measuring the electrical power of, for example, radiofrequency signals, but also for measuring the rms value, or root mean square value, of any other physical quantities over a large dynamic range, which are converted into a voltage by appropriate transducers, as is the case for example when measuring mechanical stresses by a measurement transducer or the like. The arrangement according to the invention can also be used in the same way in this case.

The invention will be explained in more detail below with the aid of schematic drawings with reference to an exemplary embodiment.

FIG. 1 shows the block diagram of a circuit according to the invention for measuring the electrical power over a large dynamic range.

First, in order to divide up the dynamic range, the radiofrequency signal with the power $p_i$ to be determined is fed to the linear network A, which uses suitably arranged splitters, attenuators or amplifiers to generate two radiofrequency signals with different powers $p_1$ and $p_2$ proportional to $p_i$. Let the powers $p_1$ and $p_2$ be dimensioned, in relation to one another, so that the usable characteristic-response ranges of the two diode rectifiers B1 and B2 partially overlap, i.e. there is an overlap region in which both B1 and B2 deliver valid results. Let the relationship $p_1 \gg p_2$ always be satisfied in this case, i.e. let channel 1 be substantially more sensitive for $p_1$ than channel 2 is, with the structure of both channels being identical.

The two generated radiofrequency signals are rectified by using the diode rectifiers B1 and B2. Since B1 and B2 are operated in the quadratic range, their output voltages $v_1$ and $v_2$ are respectively proportional to $p_1$ and $p_2$. With the aid of the choppers C1 and C2, the DC voltages $v_1$ and $v_2$ are converted into the AC voltages $v_1'$ and $v_2'$, in order to prevent the measurement result from being compromised by the offset-voltage drifts of the amplifiers D1 and D2 and the zero-point drifts of the analogue/digital converters E1 and E2. This procedure can be regarded as multiplication by a variable c which alternately takes the values +1 and −1.

The AC voltages $v_1'$ and $v_2'$ are amplified by the amplifiers D1 and D2, respectively. The amplified AC voltages $v_1''$ and $v_2''$ are subsequently converted by the analogue/digital converters E1 and E2 into the digital values $x_1$ and $x_2$, respectively. Analogue/digital conversions in E1 and E2 are initiated simultaneously by the common control signal CONV.

The digital values $x_1$ and $x_2$ are affected by offsets, i.e. in spite of a linear relationship with $p_1$ and $p_2$, respectively, they are not proportional to $p_1$ and $p_2$. Only after an offset correction, during which the offsets $o_1$ and $o_2$, respectively, are subtracted from $x_1$ and $x_2$ with the aid of the adders F1 and F2, are digital values $x_1'$ and $x_2'$ once more obtained which are proportional to $p_1$ and $p_2$, respectively. The offsets may be different for the two switching states of the choppers (e.g. owing to thermal emfs which have their origin in the diode rectifiers). Before the measurement, they are determined and stored for both switching states of the choppers (c=+1 and c=−1) by measuring $x_1$ and $x_2$ for $p_i$=0, and are stored.

The function blocks G1 and G2 are used, if necessary, to linearise the circuit's characteristic response. In the present application, there is already a linear dependency of the output voltage of the individual diode rectifiers on the power supplied to them. Since all the other circuit components likewise exhibit a linear behaviour, G1 and G2 may be omitted in the ideal case. Often, however, it is desirable to drive the diode rectifiers B1 and B2 beyond the upper limit of the quadratic range. The resulting linearity discrepancies can be corrected for by G1 and G2, in order to obtain a larger usable characteristic-response range. It should nevertheless be borne in mind that, when the diode rectifiers are driven beyond the upper limit of the quadratic range, harmonics contained in the radiofrequency signal cause higher measurement errors.

If it is not the power but, instead, the voltage rms value of a radiofrequency signal which is to be determined by the described circuit, then G1 and G2 can be used to compensate for the quadratic dependency of the output voltage of the individual diode rectifiers on their input voltage, i.e. in this case they are used to calculate the function $x''_1=\sqrt{x'_1}$ or $x''_2=\sqrt{x'_2}$, respectively. Further specific applications for G1 and G2 are obtained when using other measurement transducers with a non-linear characteristic response, e.g. in order to measure physical quantities other than the power or the voltage rms value of a radiofrequency signal.

Figure 2:
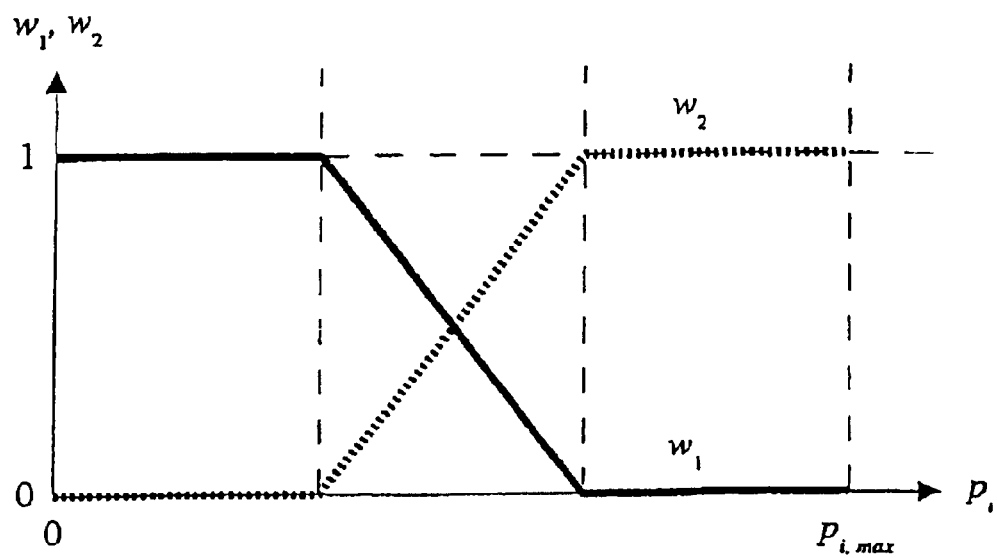

After the linearisation, the digital values $x_1''$ and $x_2''$ are weighted according to their information content, through use of the multipliers H1 and H2 to multiply them by the weighting factors $w_1$ and $w_2$. These weighting factors are generated in the function blocks H1 and H2. The degree to which the analogue/digital converter E1 is driven, for example, can be used as a measure of the information content:

If E1 is e.g. positively or negatively driven to less than one half, then E2 is driven much less (channel 2 was assumed to be substantially less sensitive than channel 1). The results of channel 2 then have a poor signal-to-noise ratio, so that the information content is to be regarded as low. In this case, $w_1$=1 and $w_2$=0 (FIG. 2). The results of channel 2 are discarded, and the results of channel 1 are further processed to 100%.

If E1 is e.g. positively or negatively driven to at least one half, but not yet fully, then both channel 1 and channel 2 give valid results. The weighting of channel 1 decreases gradually as the driving of E1 increases. Conversely, the weighting of channel 2 increases gradually. The sum of all the weighting factors must always be equal to 1.

If E1 is positively or negatively driven maximally, the results of channel 1 have a low information content because,
with further driving (overdrive), the output digital value can no longer become greater (clipping). Consequently, $w_1$=0 and $w_2$=1. It is technically expedient to tune the full driving of the analogue/digital converter in each channel to the upper limit of the usable characteristic-response range of the diode rectifier.

The weighted digital values $x_1'''$ and $x_2'''$ are multiples of different quantisation units, i.e. the same digital values represent a different power in channel 2 than in channel 1. This is the effect, on the one hand, of the network A and, on the other hand, of the different gain of D1 and D2 and the different sensitivity of B1, B2, E1 and E2 (even with fully identical dimensioning, tolerances can never be completely avoided). The multiplication by the scaling factors $s_1$, $s_2$, with the aid of the multipliers J1 and J2, compensates for these effects. The scaling factors $s_1$, $s_2$ are e.g. dependent on the carrier frequency of the radiofrequency signal. They are determined by a calibration procedure and are stored. The digital values $x_1''''$ and $x_2''''$ are multiples or fractions of the same quantisation units, i.e. the same digital values represent the same powers. They are added with the aid of the adder K.

The synchronous demodulator L makes it possible to reverse the action of the choppers C1 and C2. This is done through multiplication of y by the variable c. The digital value y already contains the variable c owing to the effect of the choppers. The rectified digital value z is ideally independent of c, because it contains this factor twice, which leads to compensation for it (1·1=1 and −1·−1=1). In practice, however, the aforementioned offset correction by using F1 and F2 is never fully achieved: The actual offsets can change constantly e.g. owing to temperature fluctuations. The adders F1 and F2, however, subtract only the offsets which were determined and stored at a particular time. Moreover, all the offset contributions which are created in the circuit downstream of C1 and C2 are multiplied by c only once, i.e. they are converted into AC voltages by L. Low-frequency noises from D1, D2, E1 and E2, whose frequency lies below the chopper frequency, are mixed with the chopper frequency by the synchronous demodulation, and are thereby spectrally modified in such a way as to facilitate, or actually make possible, subsequent noise suppression through digital filtering.

The obtained digital value z is proportional, over a large dynamic range, to the radiofrequency signal power $p_i$ to be measured. It can be processed further in a conventional way. To that end, use is made of the circuit block M, which contains e.g. the digital filtering of the measurement values, the compensation for the temperature excursion, the calculation of the voltage rms value, control functions and the measurement-value display.

Figure 3:
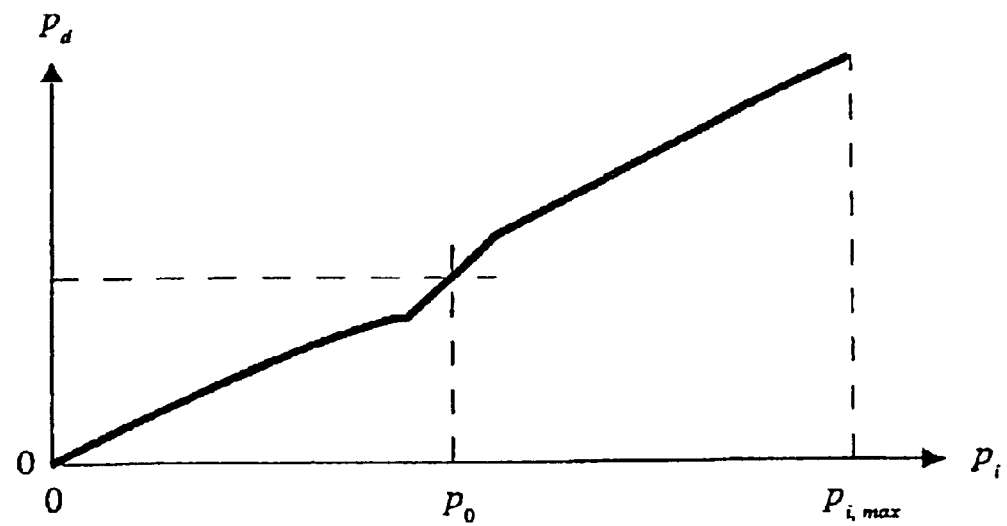

As already mentioned, the characteristic response of a circuit according to the invention does not have any discontinuities and hysteresis effects. This ensures that a particular power $p_i$=$p_0$ always has a unique displayed power value $p_d$ allocated to it (FIG. 3).

Figure 4:
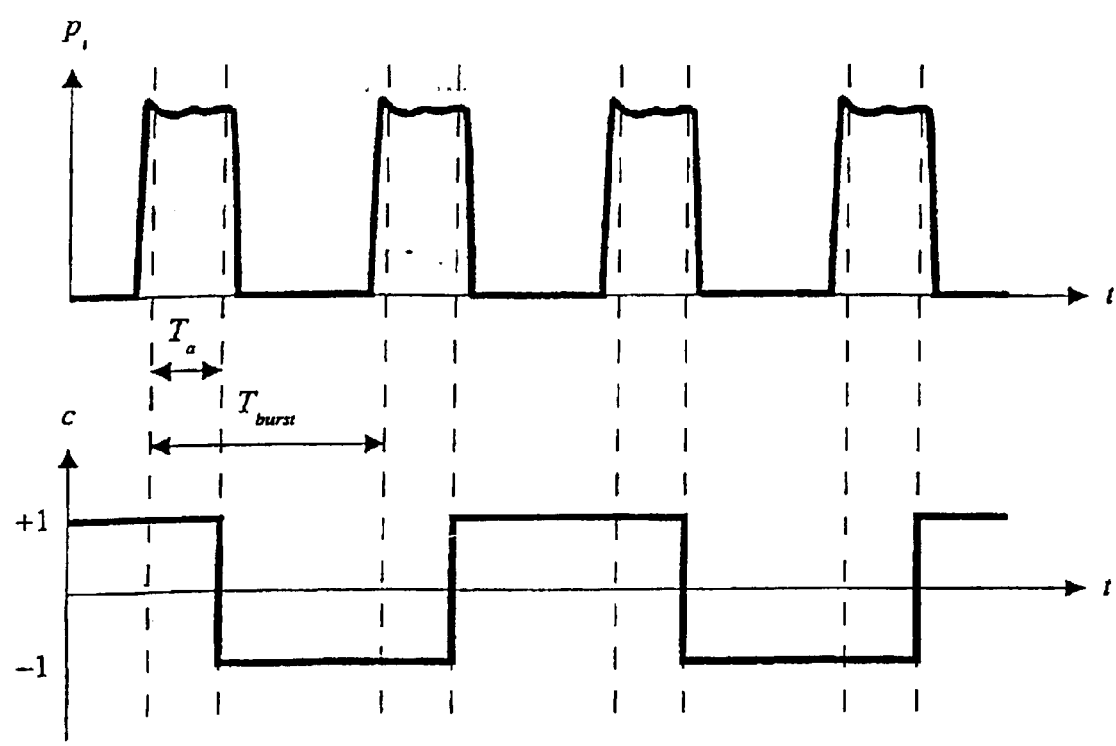

The precise function of the chopper and the synchronous demodulator can be derived from FIG. 4, which represents an example of the time profile of the variable c. The measurement task involves determining the average burst power of the signal depicted in the upper diagram. To that end, under the control of a trigger circuit, measurement data is recorded and averaged only within the measurement intervals of duration $T_a$ (aperture time). One power-average value $P_v$ is obtained per measurement interval. The sign of c is changed at the end of each measurement interval. The time until the start of a new measurement interval must be large enough for the transient settling processes in the circuit to be able to decay. An even number of power-average values $P_v$ is always recorded. This ensures that any interfering offset, which is created in the circuit downstream of the choppers and is not fully corrected by F1 or F2, occurs with a positive sign in exactly as many $P_v$ as it does with a negative sign. If the arithmetic mean of all the $P_v$ is taken, then this offset is compensated for fully. The actual measurement value P is obtained as a result of the averaging.

In the aforementioned example, the time $T_{burst}$ which indicates the period of the signal burst, lies between two sign changes of c. The chopper frequency is therefore $1/(2\ T_{burst})$. If the aperture time and the chopper frequency are not dictated by the measurement task, then a circuit according to the invention automatically selects expedient standard values for them.

Of course, the type and arrangement of the function blocks may vary in a circuit such as the one represented in FIG. 1. Owing to their linear nature, for example, the order of the multipliers may be swapped or the synchronous demodulation may be shifted to before the summation. Likewise, the represented separation into analogue and digital function blocks is merely to be regarded as being technically expedient, and without implying any limitation. For instance, it is conceivable to relocate the offset correction into the analogue part of the circuit.

What is claimed is:

1. Arrangement for measuring the rms value of an AC voltage over a large dynamic range, in particular for measuring electrical power, in which the voltage to be measured is converted into two or more voltage components proportional thereto, and each voltage component is measured by using a separate diode rectifier (B1, B2), characterised in that the output voltages of the diode rectifiers (B1, B2) are converted into a digital value, each of these digital values is weighted with weighting factors (w1, w2) whose ratio is derived from a the control drive level of at least one of the diode rectifiers (B1,B2), and, after scaling to a common quantisation unit, these weighted digital values are added to give the actual digital measurement value.

2. Arrangement for measuring the rms value of an AC voltage over a large dynamic range, in particular for measuring electrical power, in which the voltage to be measured is converted into two or more voltage components proportional thereto, and each voltage component is measured by using a separate diode rectifier (B1, B2), characterised in that the output voltages of the diode rectifiers (B1, B2) are converted into a digital value, each of these digital values is weighted with weighting factors (w1, w2) whose ratio is derived from a control drive level of at least one of the diode rectifiers (B1,B2), and, after scaling to a common quantisation unit, these weighted digital values are added to give the actual digital measurement value, and characterised in that the sum of the weighting factors is one.

3. Arrangement for measuring the rms value of an AC voltage over a large dynamic range, in particular for measuring electrical power, in which the voltage to be measured is converted into two or more voltage components proportional thereto, and each voltage component is measured by using a separate diode rectifier (B1, B2), characterised in that the output voltages of the diode rectifiers (B1, B2) are converted into a digital value, each of these digital values is weighted with weighting factors (w1, w2) whose ratio is derived from a control drive level of at least one of the diode rectifiers (B1,B2), and, after scaling to a common quantisation unit, these weighted digital values are added to give the actual digital measurement value, and characterised in that the output voltages are digitised by using a separate A/D converter in each case.

4. Arrangement according to claim 1, 2 or 3, characterised in that the scaling factors (s1, s2) are determined through a calibration procedure.

5. Arrangement according to claim 1, 2, or 3 characterised in that the A/D converter or converters are of the sampling type, and the weighting and scaling of the digital values is carried out for each sample value.

6. Arrangement according to claim 1, 2, or 3, characterised in that there is a relationship, which is defined by a polynomial, between the weighting factors (w1, w2) and the digital output value of one of the A/D converters.

7. Arrangement according to claim 6, characterised in that there is a linear relationship.

8. Arrangement according to claim 1, 2, or 3, characterised in that there is a relationship, which is defined by a piecewise linear function curve, between the weighting factors and the output of one of the A/D converters.

9. Arrangement according to claim 1, 2, or 3, characterised in that there is a relationship, which is defined by a harmonic function, between the weighting factors and the output of one of the A/D converters.

10. Arrangement according to claim 1, 2, or 3, characterised in that the output voltage of each diode rectifier is converted into an AC voltage by using a chopper and, after amplifying and digitising, is converted back again through synchronous demodulation, the switching times of the chopper and synchronous demodulator being synchronised with the measurement procedure so that the switching times respectively lie outside the measurement intervals.

11. Arrangement according to claim 10, characterised in that the start of the measurement intervals is determined by a trigger signal which is derived from the measurement signal or is externally provided, and the duration of the measurement intervals is determined by an aperture time which is freely selectable or is derived from the measurement signal, and the chopper and synchronous demodulator are alternately in the non-inverting and inverting states, respectively, for one period of the measurement signal.

12. Arrangement according to claim 1, 2, or 3, characterised in that the digital values are corrected with respect to their offset and/or are linearised before weighting and scaling.

13. Arrangement according to claim 1, 2, or 3 characterised in that the output voltages of the diode rectifiers (B1, B2) are in each case converted into proportional digital values.

\* \* \* \* \*